United States Patent
Higuchi et al.

(10) Patent No.: US 8,436,253 B2
(45) Date of Patent: May 7, 2013

(54) METHOD OF MANUFACTURING MOUNTING STRUCTURE AND MOUNTING STRUCTURE

(75) Inventors: Takayuki Higuchi, Osaka (JP);
Yoshihiro Tomura, Osaka (JP);
Kazuhiro Nobori, Osaka (JP); Kentaro Kumazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 273 days.

(21) Appl. No.: 12/992,306

(22) PCT Filed: Mar. 23, 2009

(86) PCT No.: PCT/JP2009/001264
§ 371 (c)(1),
(2), (4) Date: Nov. 12, 2010

(87) PCT Pub. No.: WO2009/141949
PCT Pub. Date: Nov. 26, 2009

(65) Prior Publication Data
US 2011/0061913 A1 Mar. 17, 2011

(30) Foreign Application Priority Data
May 23, 2008 (JP) ................................. 2008-135928

(51) Int. Cl.
*H05K 1/00* (2006.01)
(52) U.S. Cl.
USPC ........... 174/258; 174/259; 361/760; 361/767; 361/770
(58) Field of Classification Search ............ 174/250, 174/255–259; 361/760, 767, 768, 770
See application file for complete search history.

(56) References Cited

U.S. PATENT DOCUMENTS

| 4,903,118 A * | 2/1990 | Iwade ............................ 257/783 |
| 6,063,649 A * | 5/2000 | Yoshino ........................ 438/118 |
| 7,145,219 B2 * | 12/2006 | Faris ............................. 257/618 |
| 2008/0135283 A1 | 6/2008 | Hibino et al. |

FOREIGN PATENT DOCUMENTS

| JP | 2004-312051 A | 11/2004 |
| JP | 2006-319253 A | 11/2006 |
| WO | WO 2006/112384 A1 | 10/2006 |

OTHER PUBLICATIONS

Chinese Office Action for Application No. 200980118786.4 dated Apr. 19, 2012.
International Search Report for PCT/JP2009/001264, Apr. 21, 2009, Matsushita Electric Ind. Co. Ltd.

* cited by examiner

*Primary Examiner* — Hoa C Nguyen
(74) *Attorney, Agent, or Firm* — RatnerPrestia

(57) ABSTRACT

A mounting structure is provided which includes an electronic component; a circuit board; a first insulating resin and a second insulating resin which are placed between the electronic component and the circuit board, for sealing; a plurality of bumps are formed on the electronic component or the circuit board; a plurality of counter electrodes of the circuit board or the electronic component, connected to the plurality of bumps; and a plurality of joining regions. The plurality of joining regions are formed by the second insulating resin, a plurality of first insulating resin regions are disposed around the joining regions so that the joining regions are sandwiched by the plurality of first insulating resin regions, the first insulating resin and the second insulating resin each contain filler, and the second insulating resin has a higher curing temperature than the curing temperature of the first insulating resin.

7 Claims, 8 Drawing Sheets

(a)

(b)

(c)

(a)

(b)

(c)

(a)

(b)

(a)

(b)

(a)

(b)

(c)

(a)

(b)

(c)

US 8,436,253 B2

METHOD OF MANUFACTURING MOUNTING STRUCTURE AND MOUNTING STRUCTURE

CROSS-REFERENCE TO RELATED APPLICATIONS

This application is a U.S. National Phase Application of PCT International Patent Application No. PCT/JP2009/001264 filed Mar. 23, 2009, claiming the benefit of priority of Japanese Patent Application No. 2008-135928 filed May 23, 2008, all of which are incorporated by reference herein in their entirety.

TECHNICAL FIELD

The present invention relates to a mounting structure in which an electronic component is mounted on a printed board for an electronic circuit and a method of manufacturing the same.

In this specification, the printed board for an electronic circuit is simply referred to as "circuit board". This "circuit board" means a mounted member such as another component on which an interposer and an electronic component are mounted.

The present invention relates to, for example, a manufacturing method for mounting an electronic component such as an IC chip, a CSP (Chip Size Package), an MCM (Multi Chip Module), a BGA (Ball Grid Array), or a surface acoustic wave (SAW) device on such a circuit board in a simplex (in the case of the IC chip, a bare IC) state and a mounting structure manufactured by the manufacturing method.

BACKGROUND ART

Nowadays, an electronic circuit board is used in every product, performance of the electronic circuit board is improved day by day, and a frequency used on the circuit board is high. Flip-chip mounting with low impedance is a mounting method suitable for an electronic apparatus that uses a high frequency. According to an increase of portable apparatuses, there is a demand for flip-chip mounting for mounting an IC chip on a circuit board in a bare state rather than a package. Besides the flip-chip, a CSP (Chip Size Package), a BGA (Ball Grid Array), and the like are used.

In the past, as a method of joining an electronic component such as an IC chip to a circuit board of an electronic apparatus, there is proposed as method of connecting electrodes of the electronic component and electrodes of the circuit board with projection bumps made by using an Au line, sealing the electrodes with a sheet or paste made of insulating resin, heating and pressing the insulating resin to cure the insulating resin, and manufacturing an electronic component mounting structure (see, for example, Japanese Patent Application Laid-Open No. 2004-312051).

In FIGS. 8(a) to 8(c), sectional schematic views for explaining the method of manufacturing a mounting structure in the past proposed in Japanese Patent Application Laid-Open No. 2004-312051 are shown. In FIGS. 8(a) to 8(c), the shape of bumps 103 is schematically represented.

As shown in FIG. 8(a), the bumps 103 are formed on electrodes 102 of an IC chip (electronic component) 101 in advance by using an Au line. Electrodes 105 are provided on both sides of a circuit board 104.

As shown in FIG. 8(a), a paste-like thermosetting insulating resin 106 is applied on the circuit board 104 side, the bumps 103 formed on the IC chip 101 attracted and held by a joining tool 100 is aligned to be opposed to the electrodes 105 of the circuit board 104, the joining tool 100 is lowered, and, as shown in FIG. 8(b), the IC chip 101 is mounted in such a degree that the bumps 103 and the electrodes 105 opposed thereto are lightly set in contact with each other. In FIG. 8(a), instead of applying the paste-like insulating resin to the circuit board 104 as the insulating resin 106, sheet-like insulating resin may be stuck to the circuit board 104.

Thereafter, as shown in FIG. 8(c), a heated heating and pressing tool 107 is pressed on the IC chip 101 to simultaneously perform heating and pressing and the electrodes 102 of the IC chip 101 and the electrodes 105 of the circuit board 104 are joined by the bumps 103. The insulating resin 106 is cured by the heating at this point and a space between the IC chip 101 and the circuit board 104 is sealed.

In this way, the method of manufacturing a mounting structure in the past is divided into a mounting stage shown in FIGS. 8(a) and 8(b) and a joining stage shown in FIG. 8(c).

DISCLOSURE OF THE INVENTION

Problems to be Solved by the Invention

However, in the manufacturing method in the past explained above, there is a problem in that the bumps 103 and the electrodes 105 of the circuit board 104 aligned in the mounting stage deviate from each other in a process of the pressing in the joining stage.

Specifically, even if the alignment is accurately performed and the IC chip 101 can be mounted on the circuit board 104 in the mounting stage shown in FIGS. 8(a) and 8(b), in the joining stage shown in FIG. 8(c), in the process for joining the electrodes 102 and the electrodes 105 with the bumps 103, in some case, the bumps 103 deviate from the electrodes 105 or completely separate from the electrodes 105 because of a tilt of the heating and pressing tool 107 and a flow of the insulating resin 106 due to the heating.

It is an object of the present invention to, taking into account the problems in the past, provide a mounting structure and a method of manufacturing the same that can suppress positional deviation between bumps and electrodes opposed thereto that occurs in a joining stage for performing heating and pressing.

Means for Solving the Problems

To solve the above-described problems,

The 1$^{st}$ aspect of the present invention is a mounting structure comprising:
    an electronic component;
    a circuit board;
    an insulating resin placed between the electronic component and the circuit board, for sealing;
    bumps are formed on the electronic component or the circuit board; and
    counter electrodes of the circuit board or the electronic component, connected to the bumps; wherein
    the insulating resin is sheet like which includes an area of a first insulating resin and an area of a second insulating resin having a higher curing temperature than the curing temperature of the first insulating resin, a whole of the bump is arranged in the area of the second insulating resin and a whole of the counter electrode is arranged in the area of the second insulating resin.

The 2$^{nd}$ aspect of the present invention is the mounting structure according to the 1$^{st}$ aspect of the present invention, wherein the first insulating resin is sheet like which is dotted with the second insulating resin. The 3$^{rd}$ aspect of the present invention is the mounting structure according to the 1$^{st}$ aspect of the present invention, wherein the first insulating resin is sheet like through which the second insulating resin are formed.

The 4th aspect of the present invention is the mounting structure according to the 1st aspect of the present invention, wherein the areas of the first insulating resin and the areas of the second insulating resin form a stripe shape.

The 5th aspect of the present invention is the mounting structure according to the 1st aspect of the present invention, wherein the areas of the first insulating resin is larger than the areas of the second insulating resin.

The 6th aspect of the present invention is the mounting structure according to the 1st aspect of the present invention, wherein the first insulating resin and the second insulating resin are made of epoxy resin and include one or more compounds selected from the group consisting of a thiolic compound, a modified amine compound, a polyfunctional phenolic compound, an imidazol compound, and an acid anhydride compound, as a curing agent.

The 7th aspect of the present invention is the mounting structure according to the 1st aspect of the present invention, wherein a difference between curing temperatures of the first insulating resin and the second insulating resin is equal to or higher than 30° C.

The 8th aspect of the present invention is a method of manufacturing a mounting structure comprising:

forming, on a circuit board, two kinds of insulating resin including a first insulating resin cured at a first curing temperature and a second insulating resin cured at a second curing temperature higher than the first curing temperature;

aligning, such that bumps formed on an electronic component or the circuit board are opposed to counter electrodes of the circuit board or the electronic component in a manner such that a whole of the bump and a whole of the counter electrode are in contact with only an area of the second insulating resin, the electronic components on the two kinds of insulating resin, wherein the aligning includes at least pre-pressing in such a degree that at least the bumps and the counter electrodes are set in contact with each other; and performing, after the aligning, full-scale pressing to join the electronic component and the circuit board, wherein the method at least includes:

heating, before the full-scale pressing or during the full-scale pressing, the first insulating resin to reach the first curing temperature; and heating, during the full-scale pressing or after the full-scale pressing, after the curing of the first insulating resin, the second insulating resin to reach the second curing temperature.

The 9th aspect of the present invention is the method of manufacturing a mounting structure according to the 8th aspect of the present invention, wherein the heating of the first insulating resin before the full-scale pressing is such heating during the pre-pressing of the aligning or such heating after the aligning and before the performing.

The 10th aspect of the present invention is the method of manufacturing a mounting structure according to the 9th aspect of the present invention, wherein a temperature rise due to the heating during the pre-pressing of the aligning or a temperature rise due to the heating after the aligning and before the performing, and a temperature rise due to the heating of the second insulating resin are continuous.

The 11th aspect of the present invention is the method of manufacturing a mounting structure according to the 9th aspect of the present invention, wherein a temperature rise due to the heating during the pre-pressing of the aligning or a temperature rise due to the heating after the aligning and before the performing, and a temperature rise due to the heating of the second insulating resin are discontinuous.

The 12th aspect of the present invention is the method of manufacturing a mounting structure according to the 8th aspect of the present invention, wherein a temperature rise to reach the second curing temperature through the first curing temperature is continuous.

The 13th aspect of the present invention is the method of manufacturing a mounting structure according to the 8th aspect of the present invention, further comprising heating the insulating resin until the insulating resin reaches the second curing temperature after a predetermined time lapses after heating the insulating resin until the insulating resin reaches the first curing temperature.

The 14th aspect of the present invention is the method of manufacturing a mounting structure according to the 8th aspect of the present invention, further comprising performing, during the aligning, pre-heating with temperature lower than the first curing temperature.

The 15th aspect of the present invention is the method of manufacturing a mounting structure according to the 8th aspect of the present invention, wherein pressure by the full-scale pressing is smaller in a case of a mounting structure having a larger number of the bumps than in a case of a mounting structure having a smaller number of the bumps.

The 16th aspect of the present invention is the method of manufacturing a mounting structure according to the 8th aspect of the present invention, wherein in the forming, the two kinds of insulating resin are arranged such that the bumps or the counter electrodes of the circuit board are arranged in areas of the second insulating resin.

The 17th aspect of the present invention is the method of manufacturing a mounting structure according to claim 8, wherein the two kinds of insulating resin are formed such that areas of the first insulating resin and areas of the second insulating resin form a stripe shape.

The 18th aspect of the present invention is the method of manufacturing a mounting structure according to the 8th aspect of the present invention, wherein the two kinds of insulating resin are arranged such that the second insulating resin surrounds the first insulating resin.

The 19th aspect of the present invention is the method of manufacturing a mounting structure according to the 8th aspect of the present invention, wherein a difference between curing temperatures of the first insulating resin and the second insulating resin is equal to or higher than 30° C.

The first invention related to the present invention is a method of manufacturing a mounting structure in which an electronic component and a circuit board are joined, the method including:

a mounting step of aligning bumps formed on the electronic component or the circuit board across two kinds of insulating resin having different curing temperatures between the electronic component and the circuit board such that the bumps are opposed to counter electrodes of the circuit board or the electronic component;

a heating step of curing the insulating resin having the low curing temperature earlier and curing the insulating resin having the high curing temperature later by raising temperature stepwise or continuously during the mounting step or after the mounting step; and a pressing step of pressing the electronic component and the circuit board from the beginning or from the middle of the heating step.

The second invention related to the present invention is the method of manufacturing a mounting structure of the first invention related to the present invention, wherein the mounting step includes arranging the two kinds of insulating resin such that the bumps are arranged in areas of the insulating resin having the high curing temperature.

The third invention related to the present invention is the method of manufacturing a mounting structure of the first or second invention related to the present invention, wherein the pressing step includes starting the heating after the insulating resin having the low curing temperature starts to be cured and before the insulating resin having the high curing temperature is cured.

The fourth invention related to the present invention is the method of manufacturing a mounting structure of the third invention related to the present invention, wherein the heating step includes heating, during the mounting step, the insulating resin with temperature higher than the curing temperature of the insulating resin having the low curing temperature and lower than the curing temperature of the insulating resin having the high curing temperature and curing the insulating resin having the low curing temperature, and the pressing step includes thereafter starting the pressing and the heating step includes further heating the insulating resin with temperature higher than the curing temperature of the insulating resin having the high curing temperature to cure the insulating resin having the high curing temperature.

The fifth invention related to the present invention is the method of manufacturing a mounting structure of the third invention related to the present invention, wherein the heating step includes heating, after the mounting step, the insulating resin with temperature higher than the curing temperature of the insulating resin having the high curing temperature, and the pressing step includes starting the pressing after the insulating resin having the low curing temperature starts to be cured and when the insulating resin having the high curing temperature is not cured.

The sixth invention related to the present invention is the method of manufacturing a mounting structure of the first or second invention related to the present invention, wherein the heating step includes heating, after the mounting step, the insulating resin with temperature higher than the curing temperature of the insulating resin having the high curing temperature, and the pressing step includes starting the pressing from the beginning of the heating step.

The seventh invention related to the present invention is a method of manufacturing a mounting structure of the fifth or sixth invention related to the present invention, wherein pre-heating by temperature lower than the curing temperature of the insulating resin having the low curing temperature may be performed during the mounting step.

The eighth invention related to the present invention is the method of manufacturing a mounting structure of any one of the first to seventh inventions related to the present invention, wherein pre-pressing at least in such a degree that the bumps and the counter electrodes are set in contact with each other may be performed during the mounting step.

The ninth invention related to the present invention is a method of manufacturing a mounting structure of the first or second invention related to the present invention, wherein pressure for the pressing the electronic component and the circuit board in the pressing step is smaller in a mounting structure including a larger number of the bumps than in a mounting structure including a smaller number of the bumps.

The tenth invention related to the present invention is the method of manufacturing a mounting structure of the second invention related to the present invention, wherein the two kinds of insulating resin are formed such that areas of the insulating resin having the low curing temperature and areas of the insulating resin having the high curing temperature are arranged in a stripe shape.

The eleventh invention related to the present invention is the method of manufacturing a mounting structure of the first or second invention related to the present invention, wherein the two kinds of insulating resin are formed such that the insulating resin having the low curing temperature is included in the inside of the insulating resin having the high curing temperature.

The twelfth invention related to the present invention is a method of manufacturing a mounting structure of any one of the first to eleventh inventions related to the present invention, wherein a difference between the curing temperature of the insulating resin having the low curing temperature and the curing temperature of the insulating resin having the high curing temperature is equal to or higher than 30° C.

ADVANTAGE OF THE INVENTION

According to the present invention, it is possible to provide a mounting structure and a method of manufacturing the same that can suppress positional deviation of bumps and electrodes opposed thereto that occurs in a joining stage for performing heating and pressing.

| Description of Symbols | |
|---|---|
| 10 | joining tool |
| 11, 21 | IC chips (electronic components) |
| 12, 22 | electrode sections of IC chips |
| 13, 23 | bumps |
| 14, 24 | circuit boards |
| 15, 25 | electrode sections of circuit boards |
| 16, 26, 36 | insulating resin (having high curing temperature) |
| 17, 27, 37 | insulating resin (having low curing temperature) |
| 18 | heating and pressing tool |
| 19, 29, 39 | insulating resin sheets |

MODE FOR CARRYING OUT THE INVENTION

Embodiments according to the present invention are explained in detail below on the basis of the drawings.

(First Embodiment)

Figure 1:
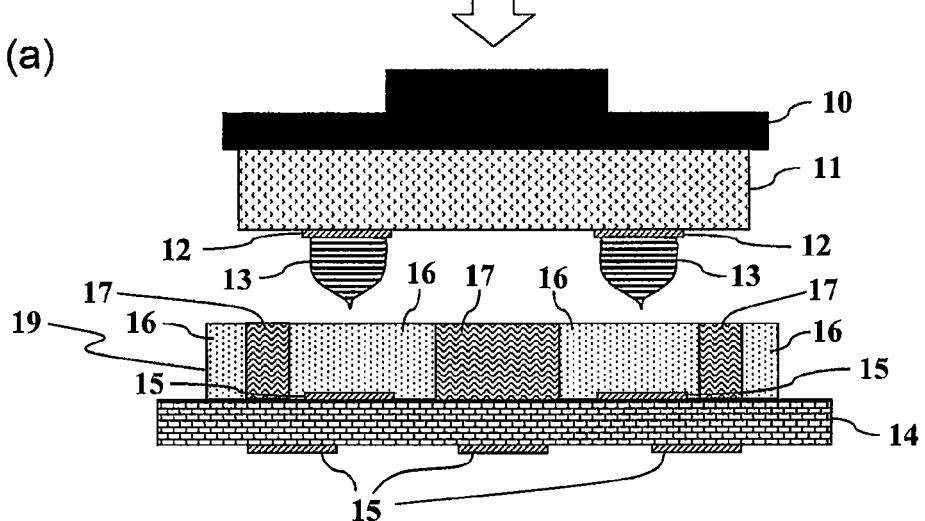
FIG. 1(a) is a sectional schematic view showing a mounting stage for explaining a method of manufacturing a mounting structure of a first embodiment of the present invention, (b) is a sectional schematic view showing the mounting stage for explaining the method of manufacturing a mounting structure of the first embodiment of the present invention, and (c) is a sectional schematic view showing a joining stage for explaining the method of manufacturing a mounting structure of the first embodiment of the present invention.
Figure 1:
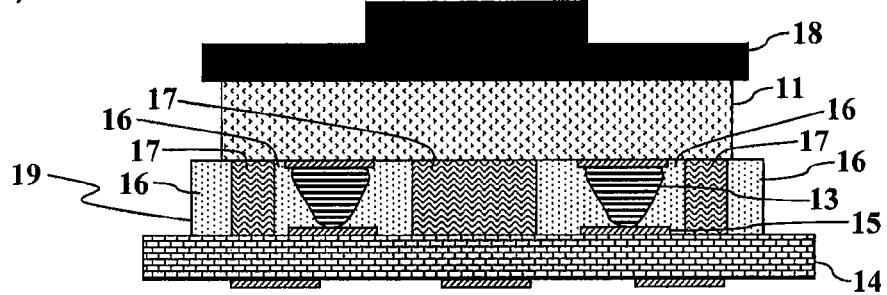
Figure 1:
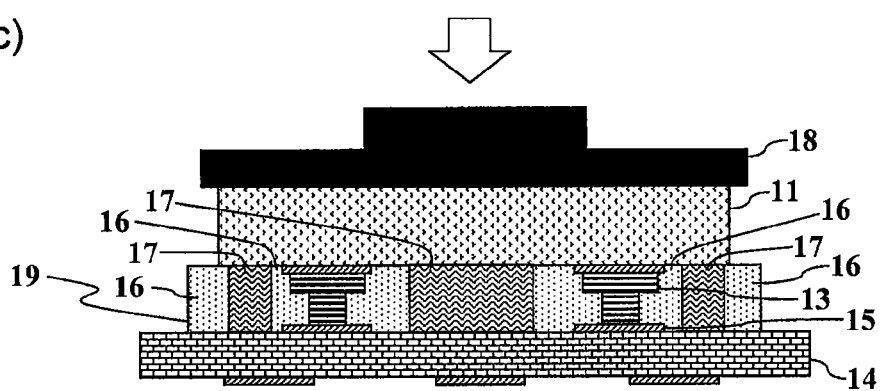

A method of manufacturing a mounting structure and a configuration of a mounting structure manufactured by the manufacturing method according to a first embodiment of the present invention are explained below with reference to FIGS. 1 and 2.

Sectional schematic views for explaining the method of manufacturing a mounting structure of the first embodiment are shown in FIGS. 1(a) to 1(c). A large number of bumps and electrodes are provided in an actual mounting structure. However, to simplify explanation, the method is explained by using schematic diagrams of a configuration in which two bumps are provided viewed from a side. In FIGS. 1(a) to 1(c), the shape of bumps 103 is schematically represented.

As shown in FIG. 1(a), circuit wires or electrode sections 12 are formed on the surface of an IC chip 11, which is an example of an electronic component of the present invention. As an example of the electrode sections 12, electrodes of Al pads are formed. A material of the electrodes may be Au or Cu or may be electrodes plated with metal on plating of Ni or the like as a base.

Metal lines, for example, gold wires (gold lines) (examples of the metal lines include wires of tin, aluminum, copper, and an alloy obtained by containing a very small amount of an element contained in these kinds of metal) are joined to the electrode sections 12 on the IC chip 11 while heat and ultrasound are applied to the metal lines by using a wire bonding apparatus or the like, the metal lines are finally torn into pieces while being pressed such that areas of a joined portion increase, and the bumps (projection electrodes) 13 are formed to be narrowed at the tips.

Subsequently, a sheet 19 of insulating resin cut in a dimension slightly larger than the size of the IC chip 11 is arranged on the circuit board 14 on which electrode sections 15 are formed.

The electrode sections 15 formed on a surface on a side of the circuit board 14 joined to the IC chip 11 are arranged in positions opposed to the bumps 13 formed on the IC chip 11 to which the electrode sections 15 are joined.

The electrode sections 15 of the circuit board 14 in this case correspond to an example of the counter electrodes of the present invention. A stage of arranging the insulating resin sheet 19 on the circuit board 14 corresponds to an example of the forming of the present invention.

Figure 2:
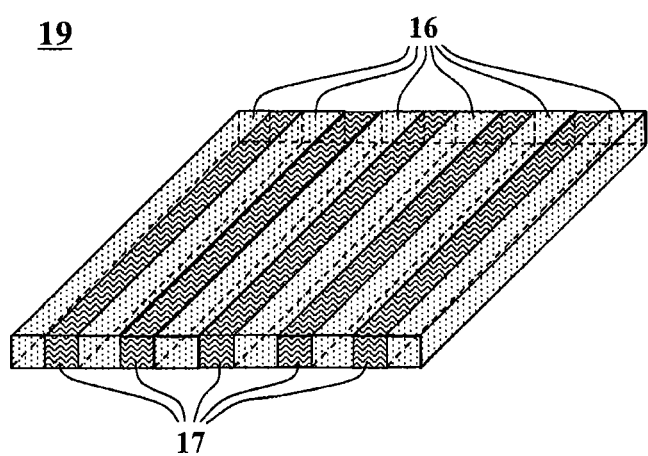
FIG. 2 is a perspective view of a configuration example of an insulating resin sheet of the first embodiment of the present invention.

In FIG. 2, a perspective view of a configuration example of the insulating resin sheet 19 arranged on the circuit board 14 is shown.

The insulating resin sheet 19 arranged on the circuit board 14 is mixed resin formed by two kinds of insulating resin having different curing temperatures. As shown in FIG. 2, insulating resin 16 having high curing temperature and insulating resin 17 having curing temperature lower than that of the insulating resin 16 are arranged in a stripe shape.

As the circuit board 14, a ceramic multilayer board, an FPC, a glass-cloth laminate epoxy board (a glass epoxy board), a glass-cloth laminate polyimide resin board, an aramid non-woven cloth epoxy board (e.g., a resin multilayer board sold as "ALIVH" (registered trademark) manufactured by Panasonic Corporation), or the like is used.

The insulating resin 16 having the high curing temperature corresponds to an example of the second insulating resin of the present invention. The insulating resin 17 having the curing temperature lower than that of the insulating resin 16 corresponds to an example of the first insulating resin of the present invention.

As the electrode sections 15 on the circuit board 14, as an example, a material obtained by plating Ni on Cu and flash-plating the surface with Au is used. However, a material same as the material described as the material of the electrode sections 12 of the IC chip 11 may be used. The material of the electrode sections 15 may be the same as the material of the electrode sections 12 of the IC chip 11 or may be different.

As mixed insulating resin (the insulating resin sheet 19) formed by the insulating resin 16 and the insulating resin 17 shown in FIG. 2, for example, a sheet of a solid or semi-solid insulating resin layer formulated with an inorganic filler is used. This mixed insulating resin is stuck on the circuit board 14, on which the electrode sections 15 are formed, with pressure of, for example, about 5 to 10 kgf/cm2 by, for example, a sticking tool or the like heated to 60 to 120° C. (temperature is desirably low).

As the insulating resins 16 and 17, insulating resin obtained by dispersing and mixing an inorganic filler such as spherical or ground silica or ceramics such as alumina in insulating resin, flattening the insulating resin with a doctor blade method or the like to evaporate a solvent component, and solidifying the insulating resin is desirable. The insulating resin desirably has heat resistance in such a degree that the insulating resin can withstand high temperature in a reflow stage in a later stage (e.g., heat resistance enough for withstanding 240° C. for 10 seconds).

As these insulating resins 16 and 17, for example, insulating thermosetting resin (the insulating thermosetting resin can include various kinds of resin such as epoxy resin, urethane resin, acryl resin, polyimide resin, polyamide resin, bismaleimide, phenolic resin, polyester resin, silicone resin, and oxetane resin) is used. These kinds of insulating thermosetting resin may be used alone or two or more kinds may be used in combination. Among these kinds of insulating thermosetting resin, in particular, the epoxy resin is suitable. As the epoxy resin, epoxy resin selected out of bisphenol epoxy resin, polyfunctional epoxy resin, flexible epoxy resin, brominated epoxy resin, glycidyl ester epoxy resin, and polymeric epoxy resin can also be used. Among these kinds of epoxy resin, for example, bisphenol A epoxy resin, bisphenol F epoxy resin, bisphenol S epoxy resin, biphenyl epoxy resin, naphthalene epoxy resin, phenolic novolac epoxy resin, cresol novolac epoxy resin, and the like are suitably used. Epoxy resin obtained by modifying these kinds of resin is also used. These kinds of resin may be used alone or two or more kinds may be used in combination.

In some case, for example, insulating resin obtained by mixing insulating thermoplastic resin (e.g., polyphenylene sulfide (PPS), polycarbonate, or modified polyphenylene oxide (PPO)) in the insulating thermosetting resin can also be used. When insulating resin obtained by mixing thermoplastic resin in the insulating thermosetting resin is used, since the thermosetting resin more dominantly functions, the insulating resin is cured by being heated in the same manner as the case of only the thermosetting resin.

A case in which the insulating thermosetting resin is used is continued to be explained below as a representative example.

As a curing agent used in combination with the insulating thermosetting resin explained above, a compound selected out of a group of a thiolic compound, a modified amine compound, a polyfunctional phenolic compound, an imidazol compound, and an acid anhydride compound can be used. These compounds may be used alone or two or more kinds may be used in combination.

As the insulating resin 16 and the insulating resin 17, insulating resins having difference in curing temperature is used in combination with the insulating thermosetting resin and the curing agent are used. Insulating resin having low curing temperature is selected for the insulating resin 17 compared with the insulating resin 16. For example, there is a combination in which, if curing reaction peak temperature of the insulating resin 16 measured by differential scanning calorimetry (DSC) is about 170° C., curing reaction peak temperature of the insulating resin 17 is about 120° C.

From the viewpoint of, for example, a temperature distribution in temperature control and process, a difference between curing temperatures of the insulating resin 16 and the insulating resin 17 is desirably set to at least 30° C. or more. More desirably, the difference is set to 40° C. or more. When this difference between curing temperatures is smaller than 30° C., it is difficult to perform the temperature control and the insulating resin 16 starts to be cured when the insulating resin 17 is cured.

The curing reaction peak temperature of the insulating resin 17 having the lower curing temperature has to be equal to or higher than temperature during sticking to the circuit board 14. As these curing temperatures, about 110 to 200° C. in the curing reaction peak temperature of the insulating resin 16 and about 80 to 160° C. in the curing reaction peak temperature of the insulating resin 17 are selected. However, about 130 to 180° C. in the curing reaction peak temperature of the insulating resin 16 and about 80 to 130° C. in the curing reaction peak temperature of the insulating resin 17 are desirable. It is desirable that these two kinds of the curing reaction peak temperatures are not close to each other as much as possible. It is desirable to use insulating resin having such curing reaction peak temperature taking into account general use conditions.

Further, a glass transition point (Tg) of the insulating resin 17 is more desirably equal to or lower than temperature for curing the insulating resin 16 because, since pressure for compressing the insulating resin 17 can be further reduced, curing contraction of the insulating resin 16 is less easily hindered during pressing.

In the following explanation, the curing reaction peak temperature of the insulating resin 17 is 120° C. and the curing reaction peak temperature of the insulating resin 16 is 170° C.

The insulating resin sheet 19 formed by these two kinds of insulating resin 16 and 17 having the different curing temperatures is arranged in a stripe shape such that respective resin layers are alternate as shown in FIG. 2. The insulating resin sheet 19 may be arranged as shown in FIG. 2 when the insulating resin sheet 19 is stuck to the circuit board 14 or may be created in advance to have a sheet shape shown in FIG. 2.

When this insulating resin sheet 19 is arranged on the circuit board 14, as shown in FIGS. 1(a) and 1(b), the insulating resin sheet 19 is arranged such that at least the insulating resin 16 is placed in areas corresponding to the electrode sections 15 on the circuit board 14.

Subsequently, in an electronic component mounted apparatus, by a joining tool 10 with the tip of a component holding member heated, while the IC chip 11 with the bumps 13 formed on the electrode sections 12 in the pre-process is attracted and held, after the IC chip 11 is aligned with respect to the circuit board 14 prepared in the pre-process such that the bumps 13 formed on the IC chip 11 are located on the electrode sections 15 of the circuit board 14 corresponding to the bumps 13 (see FIG. 1(a)), the IC chip 11 is pressed and mounted on the circuit board 14 (see FIG. 1(b)). For this alignment, a publicly-known position recognizing operation is used.

As a load in pressing and mounting the IC chip 11, a low load in such a degree that the heads of the bumps 13 reach the electrode sections 15 of the circuit board 14 and the heads of the bumps 13 are slightly deformed. The heating is performed by the joining tool 10 to stick the insulating resins 16 and 17 to a joining surface of the IC chip 11 in the same manner as sticking the insulating resins 16 and 17 on the circuit board 14 on which the electrode sections 15 are formed.

The stage until the IC chip 11 is aligned to the circuit board 14 explained above corresponds to an example of the aligning of the present invention. The low load applied in performing the alignment corresponds to an example of the pre-pressing of the present invention. The load applied at this point is different from pressure applied in joining explained later.

The heating performed to stick the insulating resins 16 and 17 to the IC chip 11 corresponds to an example of the pre-heating of the present invention. The heating at this point is different from the heating for curing the insulating resins 17 and 16 in the heating of the first insulating resin and the heating of the second insulating resin explained later.

Subsequently, heating and pressing is applied on the IC chip 11 by using the heating and pressing tool 18 and the insulating resins 16 and 17 between the IC chip 11 and the circuit board 14 are solidified.

Before performing the pressing, in order to maintain accuracy of alignment in a mounting stage by solidifying the insulating resin 17 between the IC chip 11 and the circuit board 14 earlier, the insulating resin 17 is heated for about several seconds to 20 seconds at 150° C., for example, temperature higher than the curing reaction peak temperature 120° C. of the insulating resin 17 and lower than the curing reaction peak temperature 170° C. of the insulating resin 16 to cure the insulating resin 17.

At this point, the stage for heating the insulating resin 17 at, for example, 150° C. in order to cure the insulating resin 17 corresponds to an example of the heating of the first insulating resin of the present invention.

Thereafter, in order to electrically connect the electrode sections 12 of the IC chip 11 and the electrode sections 15 of the circuit board 14 via the bumps 13, heating and pressing is applied on the IC chip 11 by using the heating and pressing tool 18 to cure the insulating resin 16 in this heating and pressing.

The temperature of the heating at this point is set to temperature higher than the curing reactive peak temperature 170° C. of the insulating resin 16, for example, 210° C.

The pressing at this point needs pressure higher than the load in the mounting stage in order to set contact resistance between the electrode sections 12 of the IC chip 11 and the electrode sections 15 of the circuit board 14 via the bumps 13 to low resistance. At this point, the heads of the bumps 13 are pressed against the electrode sections 15 of the circuit board 14 while being deformed on the electrode sections 15. A load applied to the bumps 13 side via the IC chip 11 is different depending on the outer diameter of the bumps 13. However, it is necessary to apply a load in such a degree that the heads of the bumps 13 are always deformed. This load is desirably 20 (gf/one bump) at the minimum. An upper limit of the load applied to the bumps 13 side via the IC chip 11 at this point is set to a degree for not damaging the IC chip 11, the bumps 13, the circuit board 14, and the like.

The pressure higher than the load in the mounting stage performed above corresponds to an example of full-scale pressing of the present invention. The stage for performing the pressing for joining the IC chip 11 and the circuit board 14 after the mounting step corresponds to the performing of the present invention. The stage of heating the insulating resin 16 at, for example, 210° C. in order to cure the insulating resin 16 corresponds to an example of the heating of the second insulating resin of the present invention.

A period until the heating at 210° C. is started after heating the insulating resin 17 to 150° C. corresponds to an example of the predetermined period after the insulating resin is heated to reach the first curing temperature. This predetermined period may be a short period of several seconds or may be a long period of several days. During this predetermined period, for example, the first curing temperature of 150° C. may be maintained or the temperature may once fall to temperature lower than the first curing temperature.

Timing for curing the insulating resin 17 between the IC chip 11 and the circuit board 14 only has to be before a joining stage. Therefore, the insulating resin 17 may be cured by the heating in the mounting stage.

Specifically, in the above explanation, when the IC chip 11 is mounted on the circuit board 14 by using the joining tool 10, the insulating resins 16 and 17 are heated at the temperature in such a degree that the insulating resins 16 and 17 is stuck to the IC chip 11. However, the temperature for heating by the joining tool 10 at this point may be set to temperature higher than the curing reaction peak temperature 120° C. of the insulating resin 17, for example, 150° C. to cure the insulating resin 17 in the mounting stage.

In other words, the heating of the first insulating resin of the present invention may be performed after the aligning of the present invention or may be performed during the aligning of the present invention.

As explained above, when the insulating mixed resin is arranged on the circuit board 14, the insulating mixed resin has to be arranged such that at least the insulating resin 16 is placed in areas corresponding to the electrode sections 15. In the pressing during the joining, an electric joining state between the bumps 13 and the electrode sections 15 is necessary. This is because, when the insulating mixed resin is arranged such that the insulating resin 17 is placed in the areas corresponding to the electrode sections 15, since the insulating resin 17 around contact portions of the bumps 13 and the electrode sections 15 is fixed before the pressing during the joining while a high resistance state in which the electric joining state is insufficient is kept, it is likely that the electric joining state with low resistance cannot be obtained during the pressing.

In the method of manufacturing a mounting structure of the first embodiment, since the insulating resin 17 having the low curing temperature is cured and fixed before the pressing of the joining stage, the pressing can be performed in a state in which the IC chip 11 and the circuit board 14 are highly accurately aligned in the mounting stage and positional deviation of the bumps 13 from the electrode sections 15 can be suppressed.

In the above explanation, the configuration in which the IC chip 11 in which the bumps 13 are formed on the electrode sections 12 is joined to the circuit board 14 is explained. However, the method of manufacturing a mounting structure of the first embodiment can be also be applied to a configuration in which bumps are formed on a circuit board side and an IC chip is joined to the circuit board.

In FIGS. 3(a) to 3(c), sectional schematic views for explaining a method of manufacturing a mounting structure of the first embodiment having a configuration for joining an IC chip 21 to a circuit board 24 on which bumps are formed are shown. Components same as those shown in FIGS. 1(a) to 1(c) are denoted by the same reference numerals.

FIGS. 3(a) to (c) show stages respectively corresponding to the mounting stage shown in FIGS. 1(a) and (b) and the joining stage shown in FIG. 1(c).

As shown in FIG. 3(a), circuit wires or electrode sections 25 are formed on the surface of the circuit board 24. Bumps (projection electrodes) 23 are formed on the electrode sections 25 by a method same as the method of forming the bumps 13 on the electrode sections 12 in the configuration shown in FIG. 1.

The insulating resin sheet 19 cut in a dimension slightly larger than the size of the IC chip 21 is arranged on the circuit board 24 on which the bumps 23 are formed. The insulating resin sheet 19 is the same as that used in FIG. 1. The configuration of the insulating resin sheet 19 is as shown in FIG. 2.

When the insulating resin sheet 19 is arranged on the circuit board 24, as shown in FIGS. 3(a) and 3(b), the insulating resin sheet 19 is arranged such that at least the insulating resin 16 having the high curing temperature is placed in areas where the bumps 23 are formed on the circuit board 24.

Subsequently, in an electronic component mounted apparatus, by a joining tool 10 with the tip of a component holding member heated, while the IC chip 21 is attracted and held, after the IC chip 21 is aligned such that the electrode sections 22 formed on the IC chip 21 are located in positions corresponding to the bumps 23 formed on the circuit board 24 (see FIG. 3(a)), the IC chip 21 is pressed and mounted on the circuit board 24 (see FIG. 3(b)). For this alignment, a publicly-known position recognizing operation is used. At this point, the heating is also performed by the joining tool 10 in order to stick the insulating resin sheet 19 to a joining surface of the IC chip 21.

Figure 3:
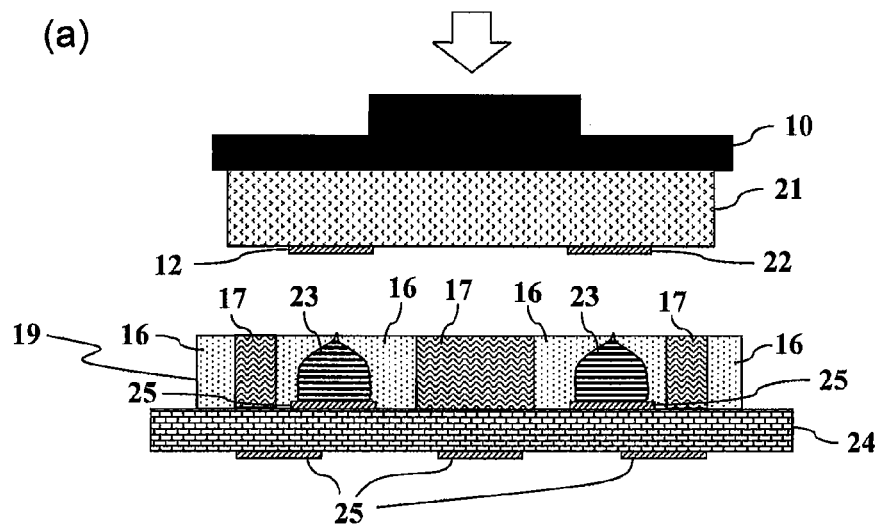
FIG. 3(a) is a sectional schematic view showing a mounting stage for explaining a method of manufacturing a mounting structure having another configuration of the first embodiment of the present invention, (b) is a sectional schematic view showing the mounting stage for explaining the method of manufacturing a mounting structure having the other configuration of the first embodiment of the present invention, and (c) is a sectional schematic view showing a joining stage for explaining the method of manufacturing a mounting structure having the other configuration of the first embodiment of the present invention.
Figure 3:
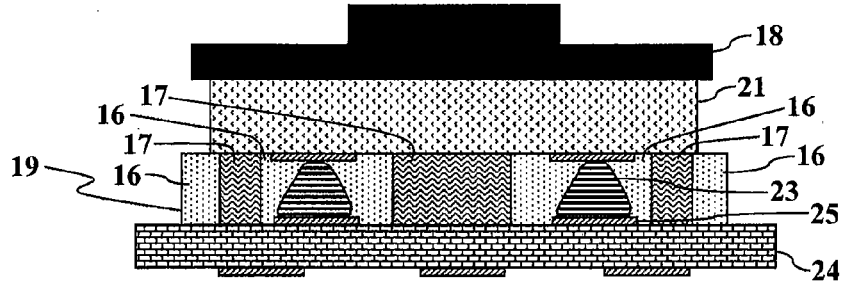
Figure 3:
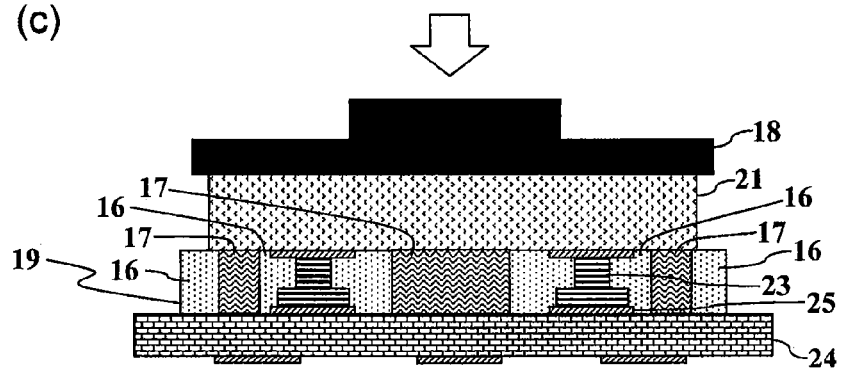

In the configuration shown in FIG. 3, the electrode sections 22 formed on the IC chip 21 correspond to an example of the counter electrodes of the present invention.

Subsequently, heating and pressing is applied on the IC chip 21 by using the heating and pressing tool 18 and the insulating resins 16 and 17 between the IC chip 21 and the circuit board 24 are solidified.

Before full-scale pressing is performed, in order to maintain accuracy of alignment in the mounting stage by solidifying the insulating resin 17 between the IC chip 21 and the circuit board 24 earlier, the insulating resin 17 is heated for about several seconds to 20 seconds at, for example, 150° C., temperature higher than the curing reaction peak temperature 120° C. of the insulating resin 17 and lower than the curing reaction peak temperature 170° C. of the insulating resin 16 to cure the insulating resin 17.

Thereafter, in order to electrically connect the electrode sections 22 of the IC chip 21 and the electrode sections 25 of the circuit board 24 via the bumps 23, heating and pressing is applied on the IC chip 21 by using the heating and pressing tool 18. The insulating resin 16 is cured in this heating and pressing.

Temperature of the heating at this point is set to temperature higher than the curing reaction peak temperature 170° C. of the insulating resin 16, for example, 210° C.

Timing for the curing of the insulating resin 17 between the IC chip 21 and the circuit board 24 only has to be before the pressing in the joining stage. Therefore, the insulating resin 17 may be cured by the heating in the mounting stage.

In the mounting structure having the configuration shown in FIGS. 3(a) to 3(c), it is also possible to suppress positional deviation between the bumps 23 and the electrode sections 22 in the mounting stage by using the manufacturing method of the first embodiment.

(Second Embodiment)

Next, a method of manufacturing a mounting structure and a configuration of a mounting structure manufactured by the manufacturing method according to a second embodiment of the present invention are explained.

Figure 4:
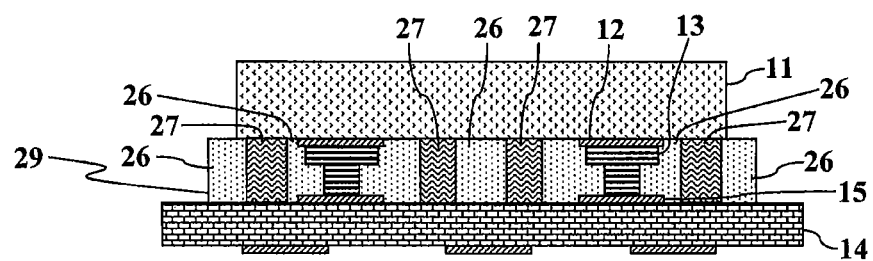
FIG. 4(a) is a sectional schematic view of a mounting structure of a second embodiment of the present invention and (b) is a perspective view of a configuration example of an insulating resin sheet of the second embodiment of the present invention.
Figure 4:
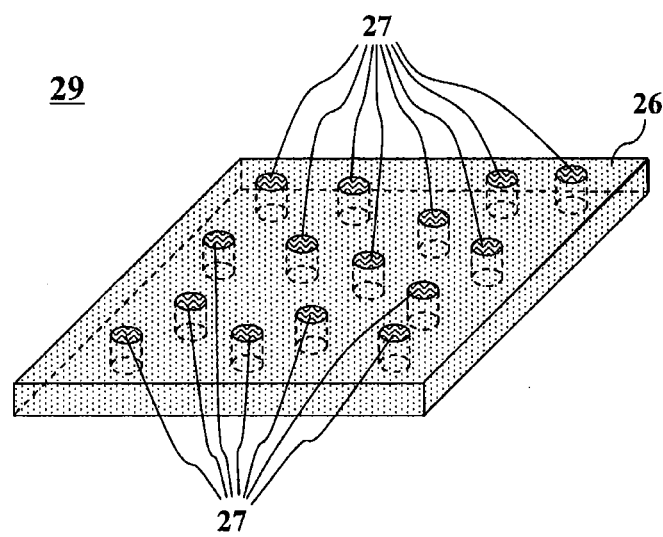

In FIG. 4(a), a sectional schematic view of the mounting structure manufactured by using the manufacturing method of the second embodiment is shown. Components same as those shown in FIGS. 1(a) to 1(c) are denoted by the same reference numerals.

The method of manufacturing a mounting structure of the second embodiment is the same as the manufacturing method of the first embodiment explained with reference to FIG. 1. However, the configuration of insulating resin to be placed between the IC chip 11 and the circuit board 14 to seal the IC chip 11 and the circuit board 14 is different from that in the case of the first embodiment.

As the insulating resin used in the second embodiment, as in the case of the first embodiment, mixed resin formed by two kinds of insulating resin having different curing temperatures is used. However, arrangement of these two kinds of insulating resin in the mixed resin and resin amounts of these two kinds of insulating resin are different from those in the first embodiment.

In FIG. 4(b), a perspective view of a configuration example of an insulating resin sheet 29 of the second embodiment arranged on the circuit board 14 is shown.

The insulating resin sheet 29 of the second embodiment arranged on the circuit board 14 is mixed resin formed by two kinds of insulating resin having different curing temperatures. As shown in FIG. 4(b), in sheet-like insulating resin 26 having high curing temperature, plural areas of insulating resin 27 having curing temperature lower than that of the insulating resin 26 are arranged.

The insulating resin sheet 29 of the second embodiment can be formed by, for example, punching through holes in necessary places of the sheet-like insulating resin 26 and filling the insulating resin 27 in the holes.

Since the insulating resin 27 can be selectively arranged in the necessary places in the insulating resin 26, the insulating resin sheet 29 is desirably used when the bumps 13 formed on the IC chip 11 are present over the entire surface of the IC chip 11.

As it is seen when the insulating resin sheet 29 of the second embodiment shown in FIG. 4(b) is compared with the insulating resin sheet 19 of the first embodiment shown in FIG. 2, in the second embodiment, an amount of the insulating resin 27 having the low curing temperature in the insulating resin 26 having the high curing temperature is small.

Therefore, compared with the case of the first embodiment, force for holding the bumps 13 formed on the IC chip 11 and the electrode sections 15 of the circuit board 14 not to deviate from each other decreases. However, instead, a load amount required during the pressing in the joining stage can be reduced.

(Third Embodiment)

Next, a method of manufacturing a mounting structure and a configuration of a mounting structure manufactured by the manufacturing method according to a third embodiment of the present invention are explained.

Figure 5:
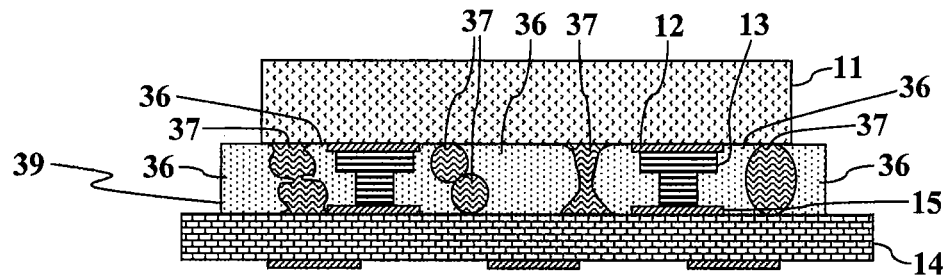
FIG. 5(a) is a sectional schematic view of a mounting structure of a third embodiment of the present invention and (b) is a perspective view of a configuration example of an insulating resin sheet of the third embodiment of the present invention.
Figure 5:
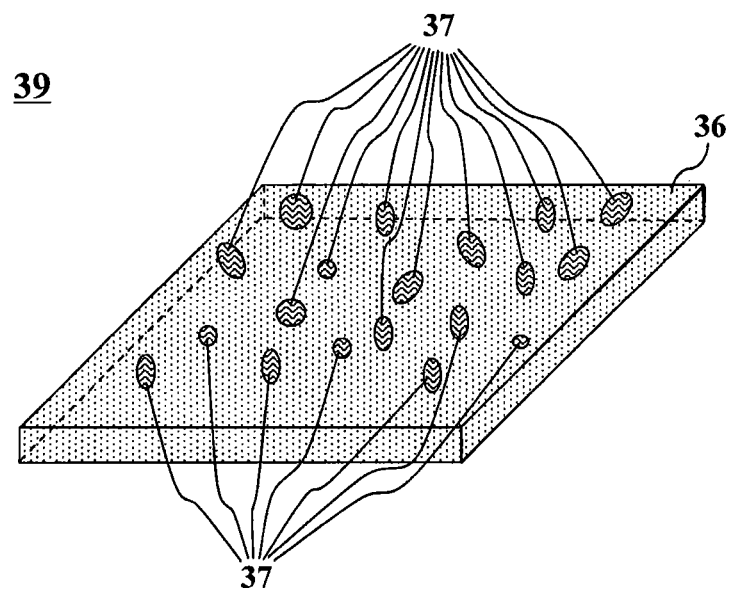

In FIG. 5(a), a sectional schematic view of the mounting structure manufactured by using the manufacturing method of the third embodiment is shown. Components same as those shown in FIGS. 1(a) to 1(c) are denoted by the same reference numerals.

The method of manufacturing a mounting structure of the third embodiment is the same as the manufacturing method of the first embodiment explained with reference to FIG. 1. However, the configuration of insulating resin to be placed between the IC chip 11 and the circuit board 14 to seal the IC chip 11 and the circuit board 14 is different from that in the case of the first embodiment.

As the insulating resin used in the third embodiment, as in the case of the first embodiment, mixed resin formed by two kinds of insulating resin having different curing temperatures is used. However, arrangement of these two kinds of insulating resin in the mixed resin and resin amounts of these two kinds of insulating resin are different from those in the first and second embodiments.

In FIG. 5(b), a perspective view of a configuration example of an insulating resin sheet 39 of the third embodiment arranged on the circuit board 14 is shown.

The insulating resin sheet 39 of the third embodiment arranged on the circuit board 14 is mixed resin formed by two kinds of insulating resin having different curing temperatures. As shown in FIG. 5(b), on the inside of sheet-like insulating resin 36 having high curing temperature, plural insulating resins 37 having curing temperature lower than that of the insulating resin 36 are arranged as dots.

The insulating resin sheet 39 of the third embodiment can be formed by, for example, applying a small amount of the insulating resin 37 having the low curing temperature on the thin sheet-like insulating resin 36 having the high curing temperature and further superimposing the thin sheet-like insulating resin 36 on the insulating resin 37.

The insulating resin sheet 39 of the third embodiment corresponds to an example of the two kinds of insulating resin in which the second insulating resin is arranged to surround the first insulating resin of the present invention.

As it is seen when the insulating resin sheet 39 of the third embodiment shown in FIG. 5(b) is compared with the insulating resin sheet 29 of the second embodiment shown in FIG. 4(b), in the third embodiment, an amount of the insulating resin 37 having the low curing temperature in the insulating resin 36 having the high curing temperature is smaller.

Therefore, compared with the case of the second embodiment, force for holding the bumps 13 formed on the IC chip 11 and the electrode sections 15 of the circuit board 14 not to deviate from each other further decreases. However, instead, a load amount required during the pressing in the joining stage can be further reduced.

Advantages of the present invention are explained below with reference to specific examples.

EXAMPLES

As an IC chip as an example of the electronic component of the present invention, an IC chip including one hundred twenty electrodes of Al pads (size is 70×70 μm) on each of four sides of 10 mm-square Si having thickness of 150 μm is used. Among the electrodes of the IC chip, in the electrodes at intervals of 1 mm on each of the sides, bumps having a diameter of 50 μm and height of 65 μm of electrode joining sections (the diameter decreases toward the tips and the tips are pointed) are formed by using Au lines having φA25 μm. In this way, ten bumps are formed on each of the sides of the IC chip.

Figure 6:
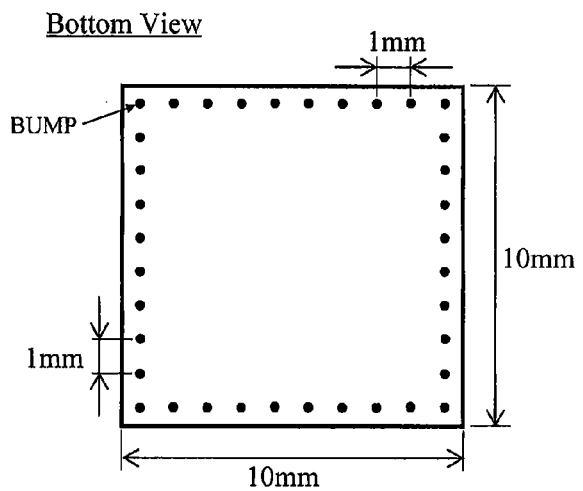
FIG. 6(a) is a bottom view of an IC chip of an example of the present invention, (b) is a bottom view of an IC chip on which bumps are arranged in zigzag, and (c) is a bottom view of an IC chip on which bumps are arranged over the entire surface thereof.
Figure 6:
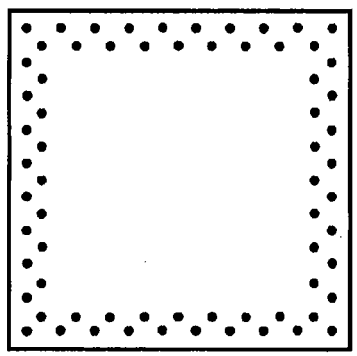
Figure 6:
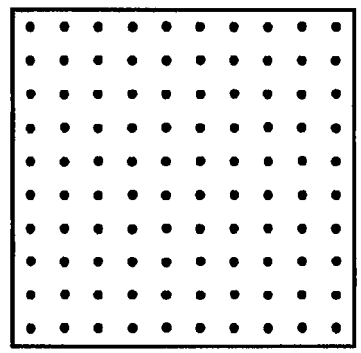

A bottom view of this IC chip is shown in FIG. 6(a).

Black dots shown in FIG. 6(a) indicate the positions of the bumps. In this way, the ten bumps are arranged on each of the four sides of the IC chip.

As a circuit board, an ALIVH board having thickness of 340 μm was used, in which electrodes formed by Ni and flash Au plating on a base of CU having 40 μm-square size were provided in places corresponding to the electrodes of the IC chip. The center of the electrodes of the circuit board and the center of the IC chip are designed to coincide with each other.

As the insulating resin having the low curing temperature, insulating resin obtained by mixing 50 weight % in total of an imidazole curing agent, which reacted at low temperature, and silica ($SiO_2$) having a particle diameter of 1 to 10 μm in 50 weight % of epoxy resin was used. As the insulating resin having the high curing temperature, insulating resin obtained by mixing 50 weight % in total of an imidazole curing agent, which reacted at high temperature, and silica ($SiO_2$) having a particle diameter of 1 to 10 μm in 50 weight % of epoxy resin was used. Curing reaction peak temperatures of the insulating resins were about 120° C. and about 170° C. in measurement by a DSC.

As the epoxy resin, bisphenol A epoxy resin+polyfunctional epoxy (epikote 828 manufactured by JER) was used. As the curing agent cured at 120° C., an imidazole curing substance (2MAOK manufactured by Shikoku Chemicals Corporation) mainly containing a 2,4-diamino-6-[2'-methylimidazole-(1')]-ethyl-S-triazineisocyanric acid adduct was used. As the curing agent cured at 170° C., an imidazole curing agent (2PHZ manufactured by Shikoku Chemicals Corporation) mainly containing a 2-phenyl-5,5-dihydroxymethylimidazole was used. As the inorganic filler $SiO_2$, an inorganic filler manufactured by Nippon Aerosil Co., Ltd. was used. As other components, a very small amount of a silane coupling agent was mixed.

Samples (mounting structures) were manufactured by a mounting machine and a heating and compression-bonding machine using four kinds of insulating resin of a comparative example and Examples 1 to 3. When the insulating resins of Examples 1 to 3 were used, the samples were respectively manufactured by using three kinds of different processes besides the process in the past. To show differences among effects of the insulating resins, in a stage in which the heating and compression-bonding machine was used, a heating and pressing tool was used while being tilted 0.1° with respect to a horizontal plane.

First, processes used this time are explained.

A "conventional process" explained below is an example of a manufacturing process in the past used for manufacturing a mounting structure. Each of a "process 1" a "process 2", and a "process 3" corresponds to an example of the manufacturing method of the present invention.

In the conventional process, a 10 N load was applied by a 30° C. joining tool and an IC chip was mounted on a circuit board by the mounting machine. Thereafter, a 50 N load was applied by a 210° C. heating and pressing tool and the insulating resin was heated and pressed by the heating and compression-bonding machine to produce a sample.

In the process 1, a 10 N load was applied by a 150° C. joining tool and an IC chip was mounted on a circuit board by the mounting machine. Thereafter, a 50 N load was applied by a 210° C. heating and pressing tool and the insulating resin was heated and pressed by the heating and compression-bonding machine to produce a sample.

In the process 2, a 10 N load was applied by a 30° C. joining tool and an IC chip was mounted on a circuit board by the mounting machine. Thereafter, in a heating and compression-bonding machine, after the insulating resin, which was cured at low temperature, was solidified, was heated by a 210° C. heating and pressing tool without being pressed until time when the insulating resin was solidified, a 50 N load was applied to solidify the insulating resin, which was cured at high temperature, to produce a sample.

In the process 3, a 10 N load was applied by a 30° C. joining tool and an IC chip was mounted on a circuit board by the mounting machine. Thereafter, in a heating and compression-bonding machine, a 50 N load was applied by a 150° C. heating and pressing tool and the insulating resin, which was cured at low temperature, was heated until the insulating resin was solidified, and the insulating resin was pressed to be thickness of a mounting structure after joining. Thereafter, the insulating resin, which was cured at high temperature, was heated at 210° C. without being pressed until the insulating resin is solidified to produce a sample.

Figure 7:
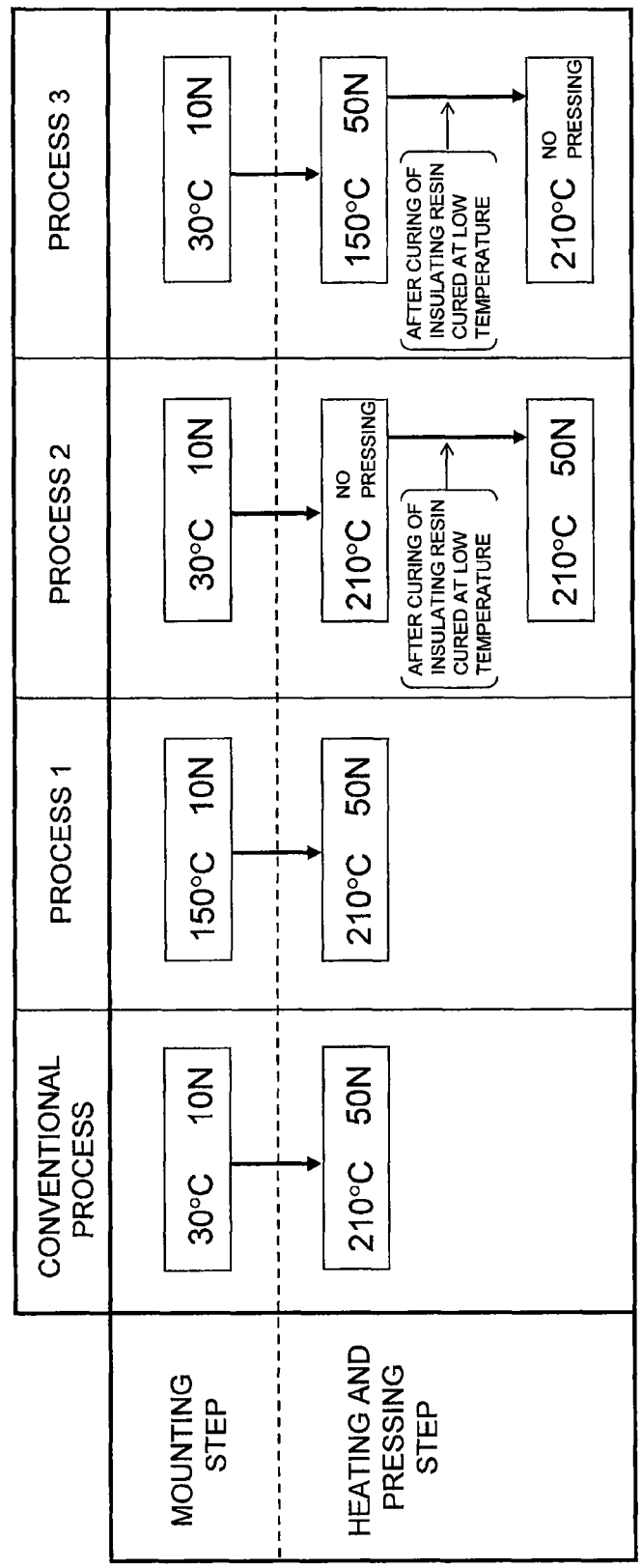
FIG. 7 is a diagram showing processing contents of a mounting step and a heating and pressing step of processes of the example.

Processing contents of the mounting step and heating and pressing step in the processes are shown in FIG. 7.

The heating at "30° C." in the processes corresponds to an example of the pre-heating of the present invention. The load of "10 N" corresponds to an example of the pre-pressing of the present invention. The load of "50 N" in the processes corresponds to an example of the full-scale pressing in the performing of the present invention.

The heating at "210° C." in the conventional process and the process 2 corresponds to an example of "a temperature rise to reach the second curing temperature through the first curing temperature is continuous" of the present invention and also corresponds to an example of "after the aligning, a temperature rise due to the heating before the full-scale pressing and a temperature rise due to the heating of the second insulating resin are continuous" of the present invention.

A temperature change in "after the insulating resin is heated by a 150° C. joining tool during the mounting, the insulating resin is heated by a 210° C. heating and pressing tool in the heating and pressing step" in the process 1 corresponds to an example of "a temperature rise due to the heating during the pre-pressing of the aligning and a temperature rise in the heating of the second insulating resin are discontinuous" of the present invention.

Samples was manufactured in the conventional process and the processes 1 to 3 by using the insulating resins explained in the comparative example and Examples 1 to 3 below as insulating resin to be placed between an IC chip and a circuit board to seal the IC chip and the circuit board.

Comparative Example

Figure 8:
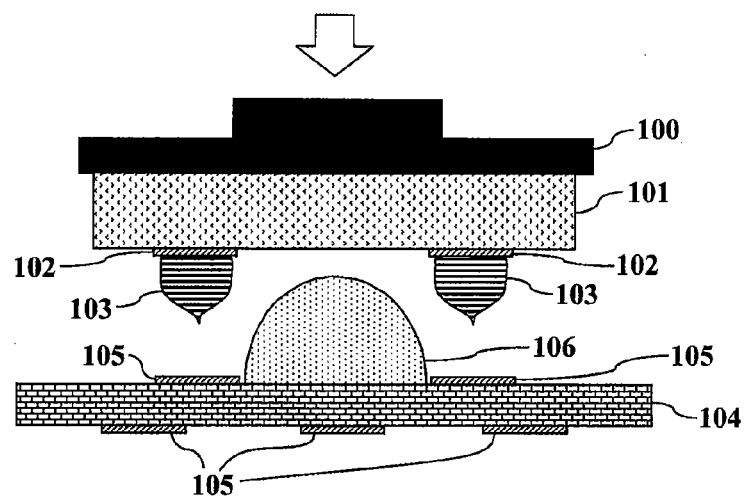
FIG. 8(a) is a sectional schematic view showing a mounting stage for explaining a method of manufacturing a mounting structure in the past, (b) is a sectional schematic view showing the mounting stage for explaining the method of manufacturing a mounting structure in the past, and (c) is a sectional schematic view showing a joining stage for explaining the method of manufacturing a mounting structure in the past.
Figure 8:
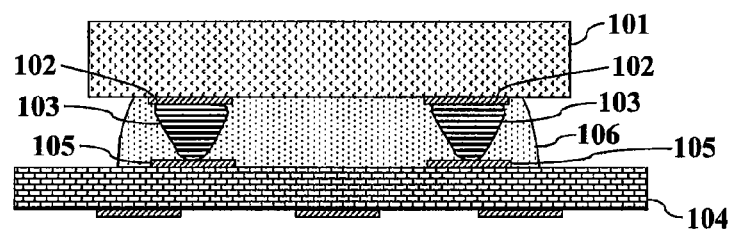
Figure 8:
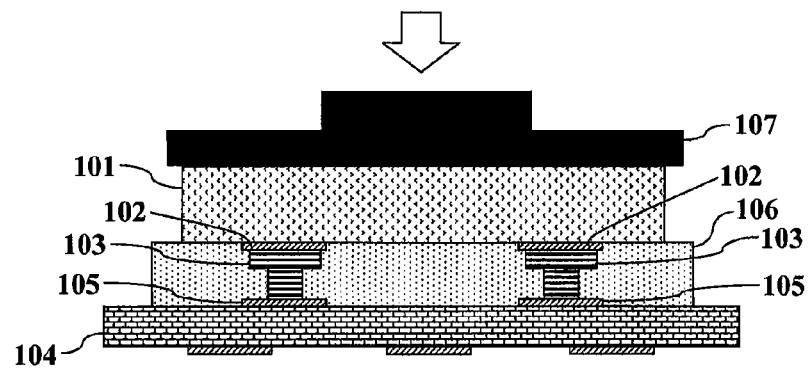

A sample was manufactured by using insulating resin having curing reaction peak temperature 170° C. as insulating resin. The insulating resin is an example of the insulating resin 106 in the past shown in FIG. 8(c).

Example 1

As insulating resin, insulating resin having curing reaction peak temperature 120° C. and insulating resin having curing reaction peak temperature 170° C. respectively having width of 0.5 mm and length of 11 mm, and thickness of 50 μm were prepared. An insulating resin sheet formed by arranging the insulating resins in a stripe shape as shown in FIG. 2 was used to produce a sample.

Specifically, an insulating resin sheet formed by alternately arranging, in a stripe shape, twelve insulating resins having curing reaction peak temperature 120° C. and eleven insulating resins having curing reaction peak temperature 170° C. was used.

Example 2

As insulating resin, thirty-six (6×6 columns) holes of φ1 mm were opened in insulating resin having 11 mm square size, thickness of 50 μm, and curing reaction peak temperature 170° C. and insulating resin of a liquid state having curing reaction peak temperature 120° C. was filled in the holes to form an insulating resin sheet shown in FIG. 4(b). A sample was produced by using this insulating resin sheet.

Example 3

As insulating resin, about 1 mm³ of insulating resin of a liquid state having curing reaction peak temperature 120° C. was applied on insulating resin having 11 mm-square size, thickness of 25 μm, and curing reaction peak temperature 170° C. and insulating resin having 11 mm-square size, thickness of 25 μm, and curing reaction peak temperature 170° C. was superimposed on the insulating resin to form an insulating resin sheet shown in FIG. 5(b). A sample was produced by using this insulating resin sheet.

A ratio of an amount of the insulating resin having the low curing temperature in the insulating resin sheet is about 48%, about 23%, and about 14% in the insulating resin sheets of Examples 1 to 3 respectively. The ratio in Example 1 is the largest and the ratio in Example 3 is the smallest.

As evaluation of a deviation amount in a sample (a mounting structure) after production, a joined portion of the sample after the production was observed by an X-ray transmission apparatus and deviation amounts of bump centers from electrode centers on a circuit board side were measured.

Samples were produced in the conventional process using the respective insulating resins of the comparative example and Examples 1 to 3. A result of the production of the samples is shown in Table 1.

TABLE 1

|  | After mounting | After the heating and pressing stage in the past |
|---|---|---|
| Comparative example 1 | Within 2 μm | 18 μm |
| Example 1 | Within 2 μm | 10 μm |
| Example 2 | Within 2 μm | 13 μm |
| Example 3 | Within 2 μm | 15 μm |

"After mounting" in Table 1 indicates a deviation amount at a point when a 10 N load was applied by a 30° C. joining tool and an IC chip was mounted on a circuit board by the mounting machine. "After the heating and pressing stage in the past" indicates a deviation amount after a 50 N load was applied by a 210° C. heating and pressing tool in the heating and pressing step after mounting the IC chip on the circuit board in the mounting step shown in FIG. 7.

From Table 1, an effect of positional deviation suppression was observed in all the cases of Examples 1 to 3 with respect to the comparative example in which the insulating resin of the conventional structure is used.

The effect of the positional deviation suppression was large as the ratio of the amount of the insulating resin having the low curing temperature is larger.

Samples were also produced in the process 1 and the process 2 by using the respective insulating resin of each of Examples 1 to 3. A result of the production of the samples is shown in Table 2.

TABLE 2

|  | After mounting | After the conventional process | After the process 1 | After the process 2 |
|---|---|---|---|---|
| Example 1 | Within 2 μm | 10 μm | 5 μm | 8 μm |
| Example 2 | Within 2 μm | 13 μm | 6 μm | 11 μm |
| Example 3 | Within 2 μm | 15 μm | 10 μm | 15 μm |

From Table 2, it is seen that, when the samples were produced in the process 1 or the process 2, the positional deviation amount could be suppressed compared with the conventional process.

When the process 1 and the process 2 are compared, the effect of positional deviation suppression was larger in the process 1.

Whereas the insulating resin having the low curing temperature is fixed in the joining stage in the process 2, in the process 1, the insulating resin having the low curing temperature is fixed at the point of the mounting stage. In other words, it can be said that the effect of deviation suppression is larger when the IC chip and the circuit board are fixed immediately after the mounting.

As in the process 3, even if the insulating resin having the high curing temperature is cured after the full-scale pressing is performed, the effect of the positional deviation suppression is obtained.

The resin material and the curing agent used in this example are examples and may be other resin materials and other curing agents. The resin material and the curing agent only have to be a resin material and a curing agent having target curing temperature that fill a space between a semiconductor chip and a circuit board and closely attach the semiconductor chip and the circuit board and are used in general.

In this example, the method of manufacturing a mounting structure of the present invention is explained in the example in which the bumps are arranged on the four sides of the IC chip as shown in FIG. 6(a). However, the method of manufacturing a mounting structure of the present invention can also be applied when the bumps are arranged in zigzag as shown in FIG. 6(b) and when the bumps are arranged over the entire surface of the IC chip as shown in FIG. 6(c).

The insulating mixed resin used for joining the IC chip and the circuit board in the present invention is arranged such that the insulating resin having the low curing temperature is not placed in the positions of the bumps. When the number of bumps increases as in FIG. 6(b) and FIG. 6(c), areas where the insulating resin having the low curing temperature can be arranged are reduced. Therefore, in these cases, the insulating resin having the low curing temperature is more easily arranged in areas other than the bumps when the insulating resin having the configuration shown in FIG. 4(b) or FIG. 5(b) is used than when the insulating resin having the configuration shown in FIG. 2 is used.

When the number of bumps increases, transistors and the like are also arranged under the electrodes on which the bumps are provided. Therefore, a load applied in the joining is desirably reduced. On the other hand, when a ratio of an amount of the resin having the low curing temperature fixed earlier increases, a load applied during the joining after the fixing of the resin has to be increased.

Therefore, as the number of bumps is larger, the ratio of the resin having the low curing temperature in the insulating mixed resin only has to be reduced. When there are a large number of bumps, since a load applied during the joining is small, a deviation amount that occurs in the joining is also small. Even if the ratio of the resin having the low curing temperature is small, a sufficient effect of the position deviation suppression can be obtained.

As explained above, in the mounting structure and the method of manufacturing the same of the present invention, the two kinds of insulating resin having the different curing temperatures are used and the insulating resin having the low curing temperature is cured and fixed before the pressing in the joining stage. Therefore, in a state in which the electronic component and the circuit board are highly accurately aligned in the mounting stage, the pressing can be performed and positional deviation of the bumps from the electrodes can be suppressed.

Among the two kinds of insulating resin having the different curing temperatures, the insulating resin having the low curing temperature is cured before the full-scale pressing is completed, whereby positional deviation between the bumps and the electrodes opposed thereto in the joining stage can be suppressed. Irrespectively of whether a temperature rise until the insulating resin having the high curing temperature is cured is continuous or discontinuous, this effect can be displayed.

With the method of manufacturing a mounting structure of the present invention, when the joining by the heating and pressing is performed after the mounting, it is possible to reduce, for example, positional deviation of the joined portion from the electrodes. The method can be generally applied to mounting of semiconductor elements of various types on the circuit board.

INDUSTRIAL APPLICABILITY

The method of manufacturing a mounting structure and the mounting structure according to the present invention have an effect of suppressing positional deviation between the bumps and the electrodes opposed thereto that occurs in the joining stage for performing the heating and pressing and are useful as, for example, a method of mounting, in a simplex state, an electronic component such as an IC chip, a CSP, an MCM, a BGA, or a surface acoustic wave (SAW) device on a mounting member such as another component on which an interposer and an electronic component are mounted and a mounting structure manufactured by the manufacturing method.

The invention claimed is:

1. A mounting structure comprising:
an electronic component;
a circuit board;
a first insulating resin and a second insulating resin which are placed between the electronic component and the circuit board, for sealing;
a plurality of bumps are formed on the electronic component or the circuit board;
a plurality of counter electrodes of the circuit board or the electronic component, connected to the plurality of bumps; and
a plurality of joining regions, wherein
the plurality of joining regions are formed by the second insulating resin,
a plurality of first insulating resin regions are disposed around the joining regions so that the joining regions are sandwiched by the plurality of first insulating resin regions,
the first insulating resin and the second insulating resin each contain filler, and
the second insulating resin has a higher curing temperature than the curing temperature of the first insulating resin.

2. The mounting structure according to claim 1, wherein the first insulating resin is sheet like which is dotted with the second insulating resin.

3. The mounting structure according to claim 1, wherein the first insulating resin is sheet like through which the second insulating resin are formed.

4. The mounting structure according to claim 1, wherein the areas of the first insulating resin and the areas of the second insulating resin form a stripe shape.

5. The mounting structure according to claim 1, wherein the areas of the first insulating resin is larger than the areas of the second insulating resin.

6. The mounting structure according to claim 1, wherein the first insulating resin and the second insulating resin are made of epoxy resin and include one or more compounds selected from the group consisting of a thiolic compound, a modified amine compound, a polyfunctional phenolic compound, an imidazol compound, and an acid anhydride compound, as a curing agent.

7. The mounting structure according to claim 1, wherein a difference between curing temperatures of the first insulating resin and the second insulating resin is equal to or higher than 30° C.

* * * * *